United States Patent
Hsu et al.

(10) Patent No.: US 12,341,091 B2
(45) Date of Patent: Jun. 24, 2025

(54) SEMICONDUCTOR PACKAGES HAVING CONDUCTIVE PATTERNS OF REDISTRIBUTION STRUCTURE HAVING ELLIPSE-LIKE SHAPE

(71) Applicant: Taiwan Semiconductor Manufacturing Company, Ltd., Hsinchu (TW)

(72) Inventors: Chia-Kuei Hsu, Hsinchu (TW); Ming-Chih Yew, Hsinchu (TW); Po-Chen Lai, Hsinchu County (TW); Chin-Hua Wang, New Taipei (TW); Po-Yao Lin, Hsinchu County (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/359,898

(22) Filed: Jul. 27, 2023

(65) Prior Publication Data
US 2023/0369194 A1    Nov. 16, 2023

Related U.S. Application Data

(63) Continuation of application No. 17/458,560, filed on Aug. 27, 2021, now Pat. No. 11,862,549.

(51) Int. Cl.
*H01L 23/498* (2006.01)
*H01L 23/00* (2006.01)
*H01L 23/31* (2006.01)
*H01L 25/18* (2023.01)

(52) U.S. Cl.
CPC .... *H01L 23/49838* (2013.01); *H01L 23/3128* (2013.01); *H01L 23/49816* (2013.01); *H01L 23/49822* (2013.01); *H01L 24/32* (2013.01); *H01L 25/18* (2013.01); *H01L 2224/32225* (2013.01)

(58) Field of Classification Search
CPC .......... H01L 23/49838; H01L 23/3128; H01L 23/49816; H01L 23/49822; H01L 24/32
See application file for complete search history.

(56) References Cited

U.S. PATENT DOCUMENTS

| | | | |
|---|---|---|---|
| 2019/0088547 A1* | 3/2019 | Chiu | H01L 23/3135 |
| 2019/0164919 A1* | 5/2019 | Hu | H01L 23/544 |
| 2020/0035631 A1* | 1/2020 | Chang | H01L 24/06 |
| 2020/0168574 A1* | 5/2020 | Huang | H01L 21/4814 |

* cited by examiner

*Primary Examiner* — Michael Jung
(74) *Attorney, Agent, or Firm* — JCIPRNET

(57) ABSTRACT

A semiconductor package includes a die, a first conductive pattern, a second conductive pattern and first and second under-ball metallurgy (UBM) patterns. The first conductive pattern and the second conductive pattern are disposed below and electrically connected to the die, wherein the first conductive pattern has an ellipse-like shape, and the second conductive pattern has a circular shape. The first and second under-ball metallurgy (UBM) patterns correspond to the first and second conductive patterns, the first conductive pattern has a first length, the second conductive pattern has a second length, the first and second UBM patterns have a third length, wherein the first length is larger than the third length and the second length is smaller than the third length.

20 Claims, 11 Drawing Sheets

SEMICONDUCTOR PACKAGES HAVING CONDUCTIVE PATTERNS OF REDISTRIBUTION STRUCTURE HAVING ELLIPSE-LIKE SHAPE

CROSS-REFERENCE TO RELATED APPLICATION

This application is a continuation application of and claims the priority benefit of a prior application Ser. No. 17/458,560, filed on Aug. 27, 2021. The entirety of the above-mentioned patent application is hereby incorporated by reference herein and made a part of this specification.

BACKGROUND

The semiconductor industry has experienced rapid growth due to continuous improvements in the integration density of various electronic components (e.g., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Currently, integrated fan-out packages are becoming increasingly popular for their compactness. How to ensure the reliability of the integrated fan-out packages has become a challenge in the field.

DETAILED DESCRIPTION

Figure 1A:
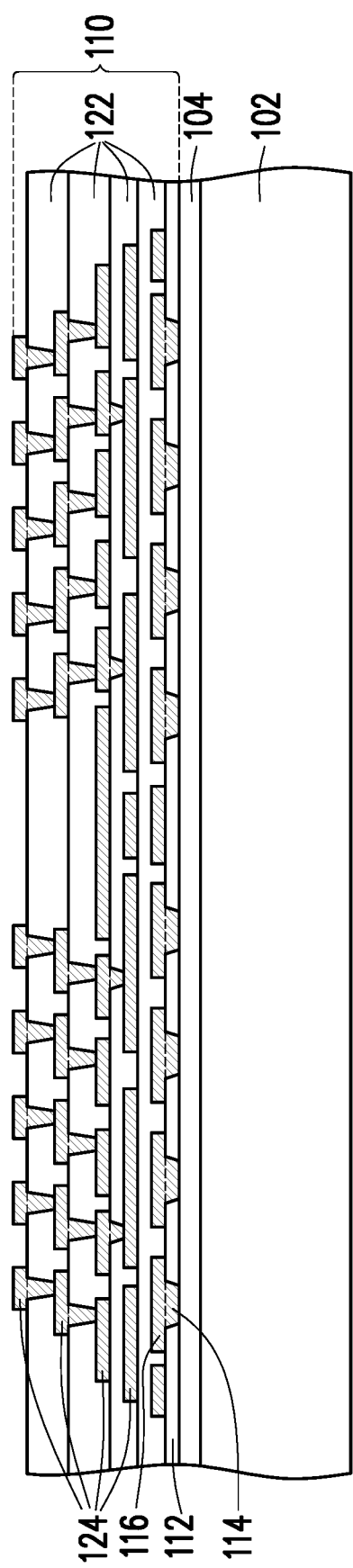
FIG. 1A to FIG. 1E are schematic cross-sectional views illustrating a manufacturing process of a semiconductor package in accordance with some embodiments of the disclosure.

The following disclosure provides many different embodiments, or examples, for implementing different features of the provided subject matter. Specific examples of components and arrangements are described below to simplify the disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "top," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1E are schematic cross-sectional views illustrating a manufacturing process of a semiconductor package in accordance with some embodiments of the disclosure. Referring to FIG. 1A, a carrier 102 having a de-bonding layer 104 thereon is provided. In some embodiments, the de-bonding layer 104 is formed on a top surface of the carrier 102. For example, the carrier 102 is a glass substrate and the de-bonding layer 104 is a light-to-heat conversion (LTHC) release layer formed on the glass substrate. However, the disclosure is not limited thereto, and other suitable materials may be adapted for the carrier 102 and the de-bonding layer 104. In alternative embodiments, a buffer layer (not shown) is coated on the de-bonding layer 104, where the de-bonding layer 104 is sandwiched between the buffer layer and the carrier 102, and a top surface of the buffer layer further provides a high degree of coplanarity. The buffer layer may be a dielectric material layer or a polymer layer which is made of polyimide, BCB, PBO, or any other suitable polymer-based dielectric material.

Then, a redistribution structure 110 is formed over the carrier 102. In some embodiments, first, a passivation layer 112 is formed on the de-bonding layer 104. A material of the passivation layer 112 may include polyimide, polyimide derivative, polybenzoxazole (PBO), or any other suitable dielectric material. The passivation layer 112 may be formed by spin-on coating, chemical vapor deposition (CVD), plasma-enhanced chemical vapor deposition (PECVD), or the like. The passivation layer 112 is a single layer or multiple layers. After forming the passivation layer 112, a plurality of conductive vias 114 are formed in the passivation layer 112, and a plurality of conductive patterns 116 are formed on the conductive vias 114 to electrically connect to the conductive vias 114 respectively. In some embodiments, a plurality of openings (not shown) are formed in the passivation layer 112, and the conductive vias 114 are formed in the openings. The conductive patterns 116 are then formed on the conductive vias 114 respectively. In some embodiments, the conductive vias 114 and the conductive patterns 116 are formed integrally by a dual damascene process. In alternative embodiments, the conductive vias 114 and the conductive patterns 116 are formed separately by a single damascene process or any other suitable process. The conductive vias 114 and the conductive patterns 116 may each include a diffusion barrier layer and a conductive material thereon. The diffusion barrier layer may include one or more layers of TaN, Ta, TiN, Ti, CoW, or the like and be formed by ALD, or the like, and the conductive material may include copper, aluminum, tungsten, silver, combinations thereof, or the like and be formed by CVD, PVD, a plating process, or the like. The number of the conductive vias 114 and the conductive patterns 116 is not limited in the disclosure.

After forming the conductive patterns 116, a plurality of dielectric layers 122 and a plurality of conductive patterns 124 are alternately formed over the conductive patterns 116, to complete the formation of the redistribution structure 110. The conductive patterns 124 may include vias and/or traces to interconnect any devices and/or to an external device. The dielectric layers 122 may include silicon oxide, silicon nitride, silicon carbide, silicon oxynitride, low-K dielectric material, such as PSG, BPSG, FSG, $SiO_xC_y$, Spin-On-Glass, Spin-On-Polymers, silicon carbon material, compounds thereof, composites thereof, combinations thereof, or the like. The dielectric layers 122 may be formed by spin-on coating, CVD, PECVD, HDP-CVD, or the like. The conductive patterns 124 are formed in/on the dielectric layers 122. The conductive patterns 124 may include a diffusion barrier layer and a conductive material thereon. The diffusion barrier layer may include one or more layers of TaN, Ta, TiN, Ti, CoW, or the like and be formed by ALD, or the like, and the conductive material may include copper, aluminum, tungsten, silver, and combinations thereof, or the like and be formed by CVD, PVD, a plating process, or the like. The number of the dielectric layers 122 and the conductive patterns 124 is not limited in the disclosure.

Figure 1B:
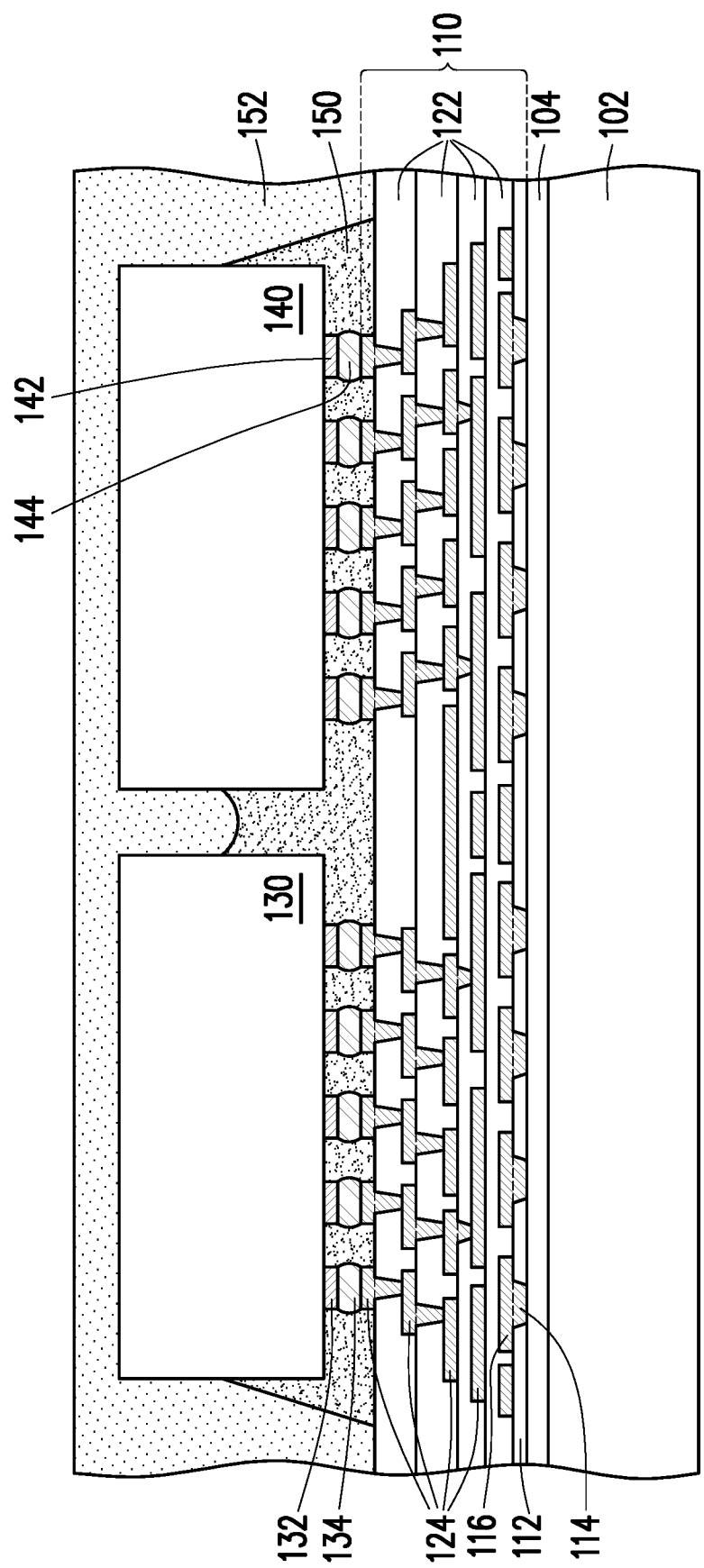

Referring to FIG. 1B, at least one die 130, 140 is bonded to the redistribution structure 110. The dies 130, 140 may each have a single function (e.g., a logic device, memory die, etc.), or may have multiple functions (e.g., a system on a chip (SoC), an application-specific integrated circuit (ASIC), etc.). In some embodiments, the die 130 is a SoC, and the die 140 is a memory device. The memory device may be a dynamic random access memory (DRAM) die, a static random access memory (SRAM) die, a hybrid memory cube (HMC) module, a high bandwidth memory (HBM) module, or the like. In an embodiment, the die 140 is an HBM module.

In some embodiments, the dies 130, 140 are bonded to the redistribution structure 110 with die connectors 134, 144. The die connectors 134, 144 may be electrically connected to bond pads 132, 142 of the dies 130, 140. In some embodiments, the dies 130, 140 are placed on the redistribution structure 110 using a pick-and-place tool. The die connectors 134, 144 may be formed from a conductive material such as solder, copper, aluminum, gold, nickel, silver, palladium, tin, the like, or combinations thereof. In some embodiments, the die connectors 134, 144 are formed by initially forming a layer of solder through methods such as evaporation, electroplating, printing, solder transfer, ball placement, or the like. Once a layer of solder has been formed on the structure, a reflow may be performed in order to shape the die connectors 134, 144 into desired bump shapes. The die connectors 134, 144 form joints between corresponding conductive patterns 124 (i.e., the outermost conductive patterns 124) on the redistribution structure 110 and the dies 130, 140, and electrically connect the redistribution structure 110 to the dies 130, 140.

Then, an underfill 150 may be formed between the dies 130, 140 and the redistribution structure 110, surrounding the die connectors 134, 144. The underfill 150 may be formed by a capillary flow process after the dies 130, 140 are attached, or may be formed by a suitable deposition method before the dies 130, 140 are attached.

After forming the underfill 150, an encapsulant 152 is formed over the dies 130, 140 and the underfill 150. The encapsulant 152 may be a molding compound, epoxy, or the like, and may be applied by compression molding, transfer molding, or the like. The encapsulant 152 may be formed over the redistribution structure 110 such that the dies 130, 140 are buried or covered. The encapsulant 152 is then cured.

Figure 1C:
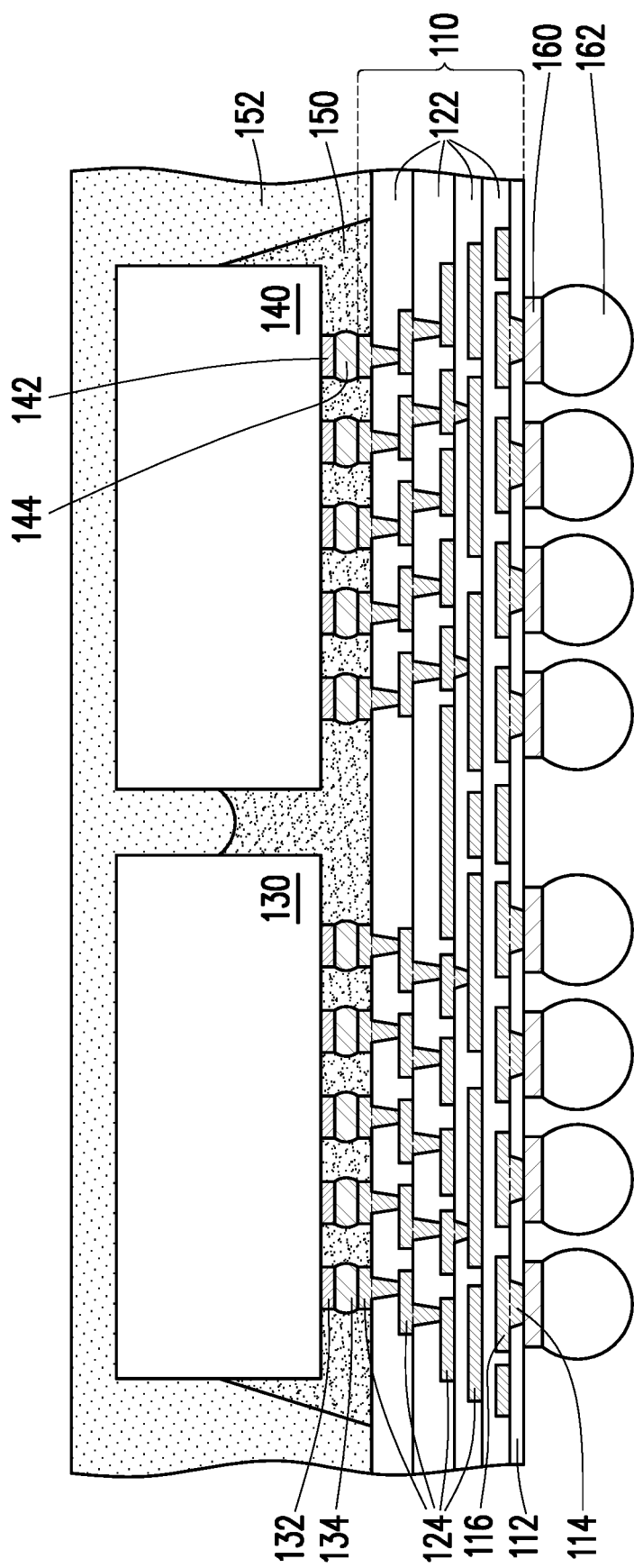

Referring to FIG. 1C, a plurality of under-ball metallurgy (UBM) patterns 160 and a plurality of conductive terminals 162 are sequentially formed on the conductive vias 114. In some embodiments, the carrier 102 is de-bonded and is separated from the passivation layer 112. In some embodiments, the de-bonding process includes projecting a light such as a laser light or an UV light on the de-bonding layer 104 (e.g., the LTHC release layer) so that the carrier 102 can be easily removed along with the de-bonding layer 104. During the de-bonding step, a tape (not shown) may be used to secure the structure before de-bonding the carrier 102 and the de-bonding layer 104. After removing the carrier 102 and the de-bonding layer 104, the UBM patterns 160 are formed on the conductive vias 114 respectively. The UBM patterns 160 may be formed for ball mount. The UBM patterns 160 include aluminum, copper, nickel, or an alloy thereof. The removal of the carrier 102 and the de-bonding layer 104 and/or formation of the UBM patterns 160 and the conductive terminals 162 may be performed while the encapsulant 152 is on a tape.

Then, the conductive terminals 162 are placed on the UBM patterns 160. The conductive terminals 162 may be controlled collapse chip connection (C4) bumps, solder balls such as a ball grid array (BGA), metal pillars, electroless nickel-electroless palladium-immersion gold technique (ENEPIG) formed bumps, or the like. The conductive terminals 162 include a conductive material such as solder, copper, aluminum, gold, nickel, silver, palladium, tin, the like, or combinations thereof. In an embodiment in which the conductive terminals 162 are solder bumps, the conductive terminals 162 are formed by initially forming a layer of solder through various methods such as evaporation, electroplating, printing, solder transfer, ball placement, or the like. In this embodiment, once a layer of solder has been formed, a reflow is performed to shape the material into the desired bump shape.

Figure 1D:
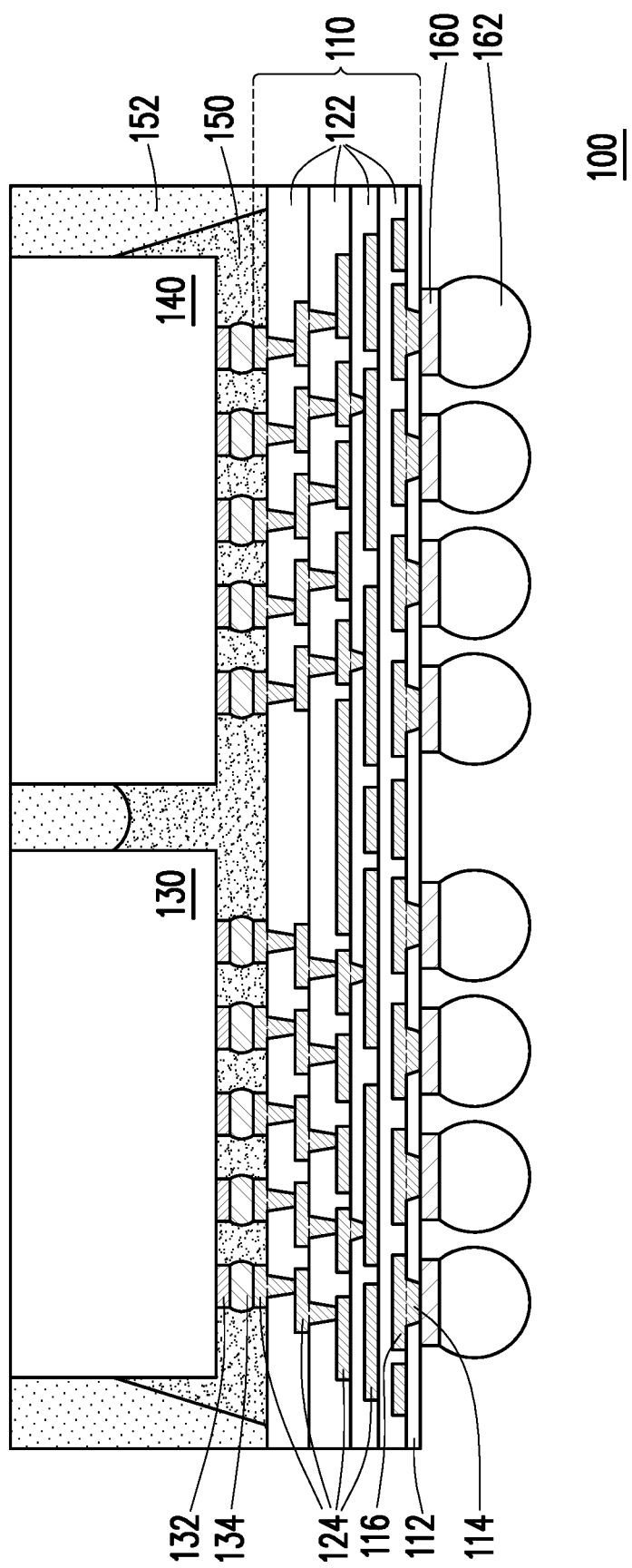

Referring to FIG. 1D, the encapsulant 152 is thinned to expose surfaces of the dies 130, 140. The thinning may be accomplished by a CMP, a grinding process, or the like. After the thinning, surfaces (e.g., top surfaces) of the encapsulant 152 and dies 130, 140 are level. In some embodiments, the redistribution structure 110 and the encapsulant 152 are singulated (not shown) by a singulation process, thereby forming a semiconductor package 100. The singulation may be performed while the redistribution structure 110 is on a tape. Singulation is performed along scribe line regions. In some embodiments, the singulation process includes a sawing process, a laser process, or combinations thereof. As shown in FIG. 1D, as a result of the singulation process, sidewalls of the redistribution structure 110 and the encapsulant 152 are substantially flush with each other. The semiconductor package 100 may integrate homogeneous or heterogeneous components. In some embodiments, the semiconductor package 100 is formed by forming the redistribution structure first, which is also referred to a redistribution layer (RDL) first process. However, the disclosure is not limited thereto.

Figure 1E:
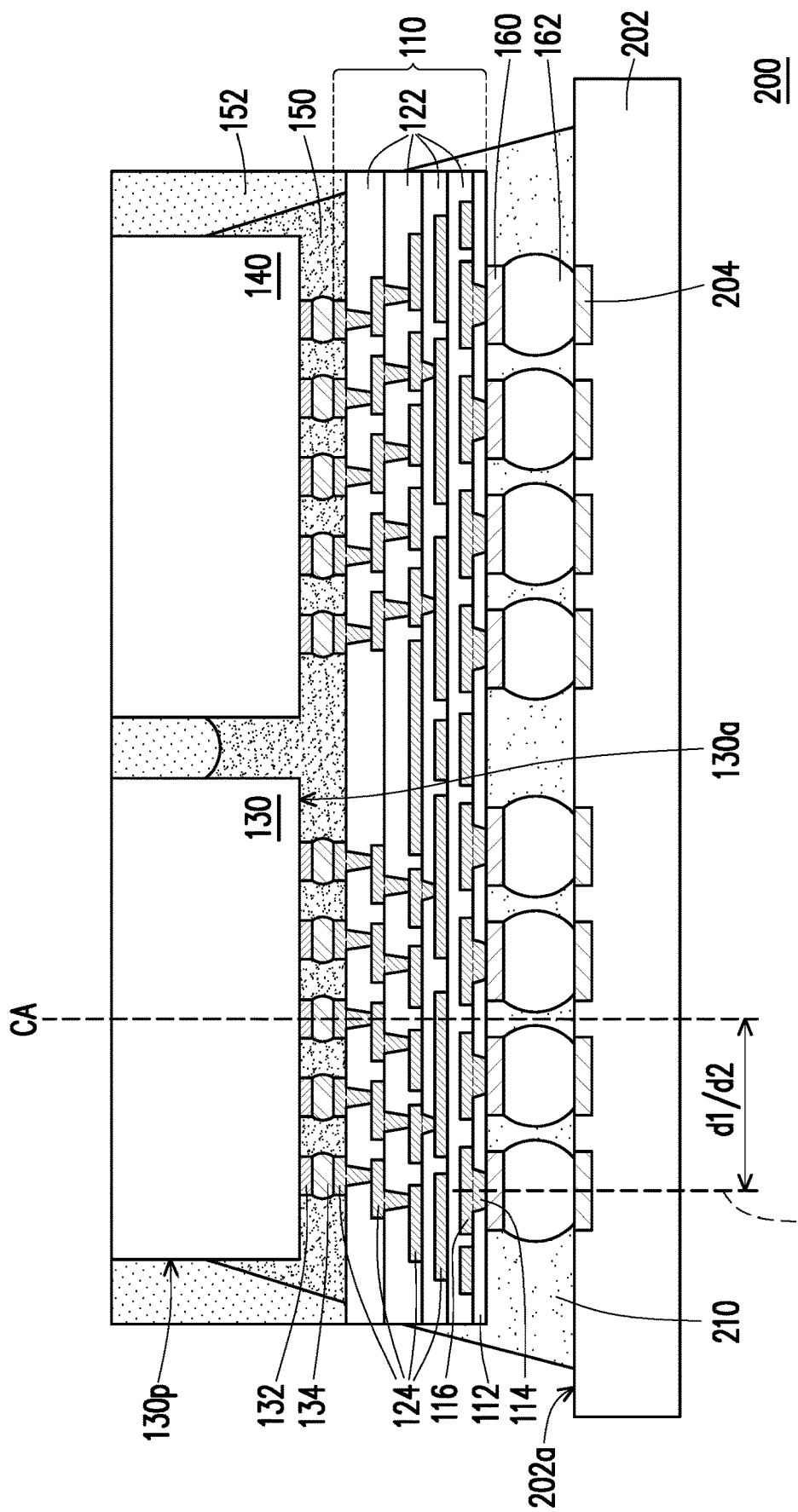

Referring to FIG. 1E, the semiconductor package 100 may be mounted onto a package substrate 202, to form a semiconductor package 200. In some embodiments, the package substrate 202 is an interposer such as an organic interposer. The package substrate 202 may include a redistribution structure. For example, the redistribution structure includes alternating dielectric layers (not shown) and conductive patterns (not shown) and a plurality of bond pads 204 over the dielectric layers and the conductive patterns. The conductive patterns may include vias and/or traces. The dielectric layers may include organic material, and the conductive patterns and the bond pads 204 may include conductive material such as copper. The conductive patterns and the bond pads 204 may be formed through any suitable process such as deposition, single damascene, dual damascene, or the like. In some embodiments, the package substrate 202 is substantially free of active and passive devices. However, the disclosure is not limited thereto.

In alternative embodiments, the package substrate 202 is made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations thereof, and the like, may also be used. Additionally, the package substrate 202 may be a SOI substrate. Generally, an SOI substrate includes a layer of a semiconductor material such as epitaxial silicon, germanium, silicon germanium, SOI, SGOI, or combinations thereof. The package substrate 202 may include active and passive devices (not shown). As one of ordinary skill in the art will recognize, a wide variety of devices such as transistors, capacitors, resistors, combinations of these, and the like may be used to generate the structural and functional requirements of the design for the semiconductor package 200. The devices may be formed using any suitable methods. The package substrate 202 may include the redistribution structure. The redistribution structure includes alternating dielectric layers (not shown) and conductive patterns (not shown) and a plurality of bond pads 204 over the dielectric layers and the conductive patterns. The conductive patterns and the bond pads 204 are formed over the active and passive devices and are designed to connect the various devices to form functional circuitry. The dielectric layers may include low-k dielectric material and the conductive patterns and the bond pads 204 may include conductive material such as copper. In alternative embodiments, the package substrate 202 is a printed circuit board such as a laminate substrate formed as a stack of multiple thin layers (or laminates) of a polymer material such as bismaleimide triazine (BT), FR-4, ABF, or the like. However, any other suitable substrate, such as an organic substrate, a ceramic substrate, or the like, may alternatively be utilized, and all such redistributive substrates that provide support and connectivity to the semiconductor package 100 are fully intended to be included in some embodiments.

In some embodiments, the conductive terminals 162 are reflowed to attach the semiconductor package 100 to the bond pads 204, thereby bonding the semiconductor package 100 to the package substrate 202. The conductive terminals 162 electrically and/or physically couple the package substrate 202 to the semiconductor package 100. In alternative embodiments, passive devices (e.g., surface mount devices (SMDs), not illustrated) may be attached to the package substrate 202 (e.g., bonded to the bond pads 204) prior to mounting the semiconductor package 100 on the package substrate 202. In such embodiments, the passive devices may be bonded to a same surface of the package substrate 202 as the conductive terminals 162.

In some embodiments, after bonding the semiconductor package 100 onto the package substrate 202, an underfill 210 is formed between the semiconductor package 100 and the package substrate 202, surrounding the conductive terminals 162. The underfill 210 may be formed by a capillary flow process.

In some embodiments, the geometry and the arrangement of the conductive patterns 116 with respect to the die (e.g., the die 130) play significant roles in ensuring the reliability of the formed semiconductor package 100. The configuration of the conductive patterns 116 will be described in detail below in conjunction with FIG. 2A and FIG. 2B.

Figure 2A:
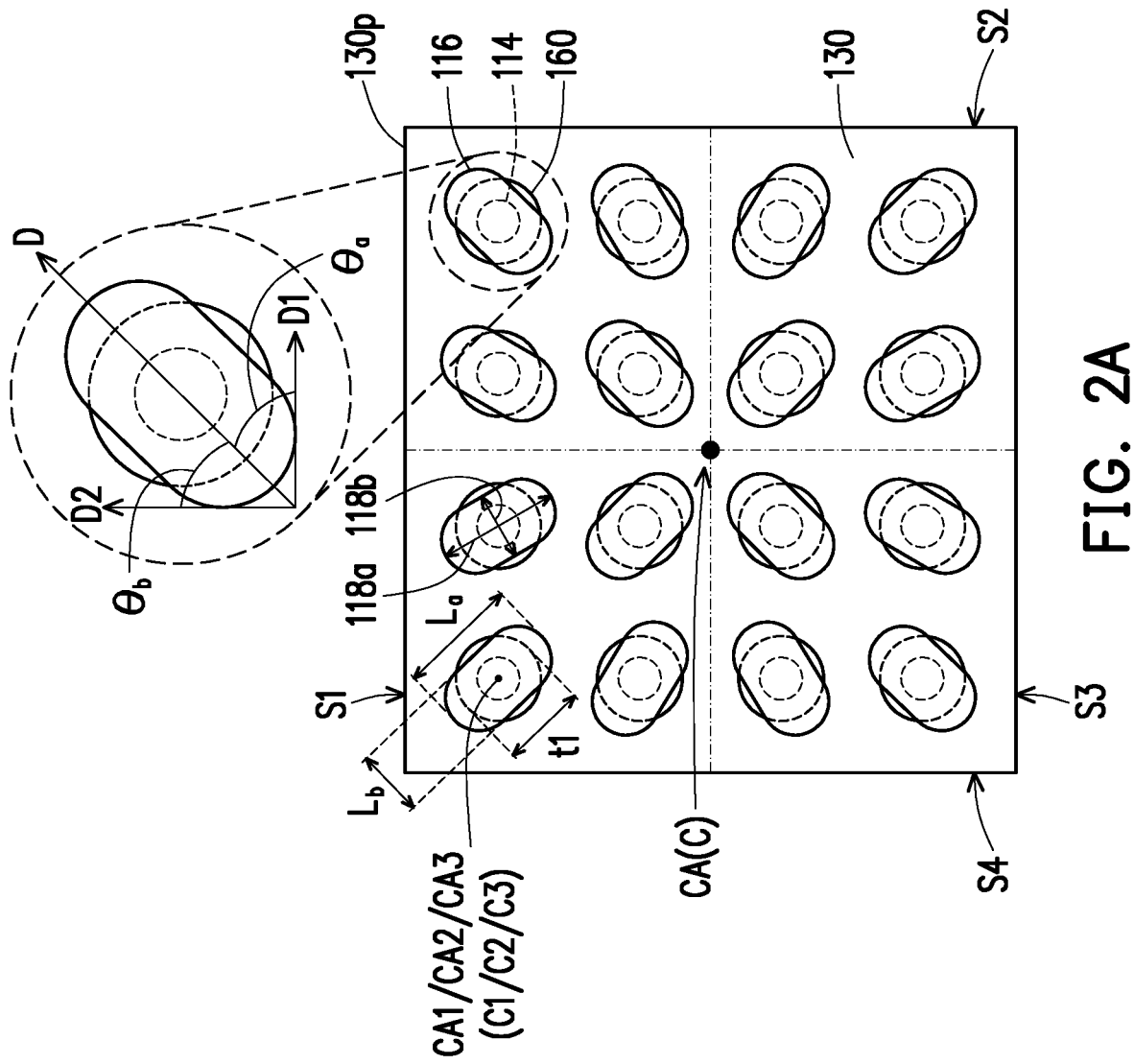
FIG. 2A and FIG. 2B are simplified top views illustrating various arrangements of the conductive patterns in FIG. 1E.
Figure 2B:
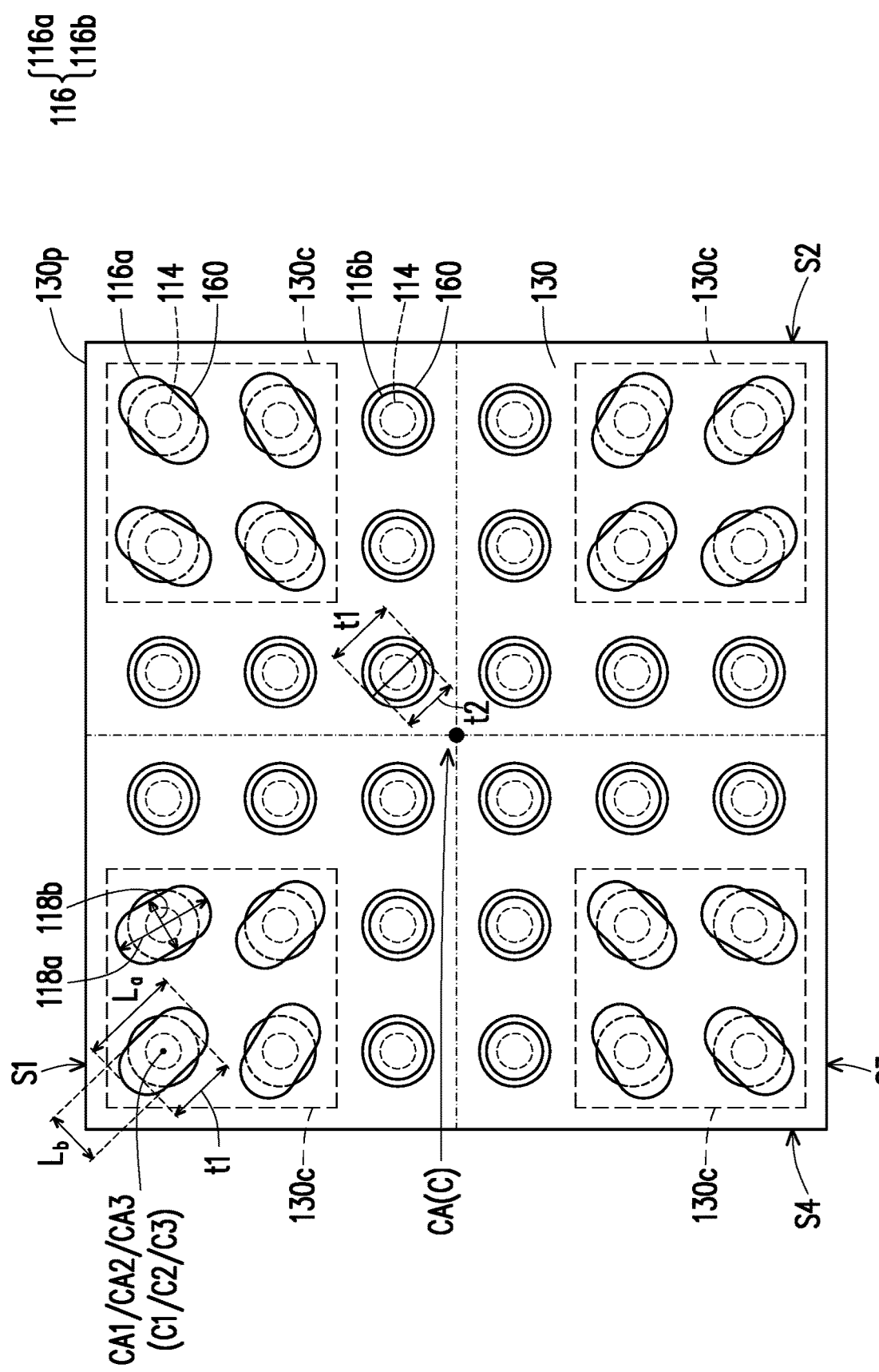
Figure 4A:
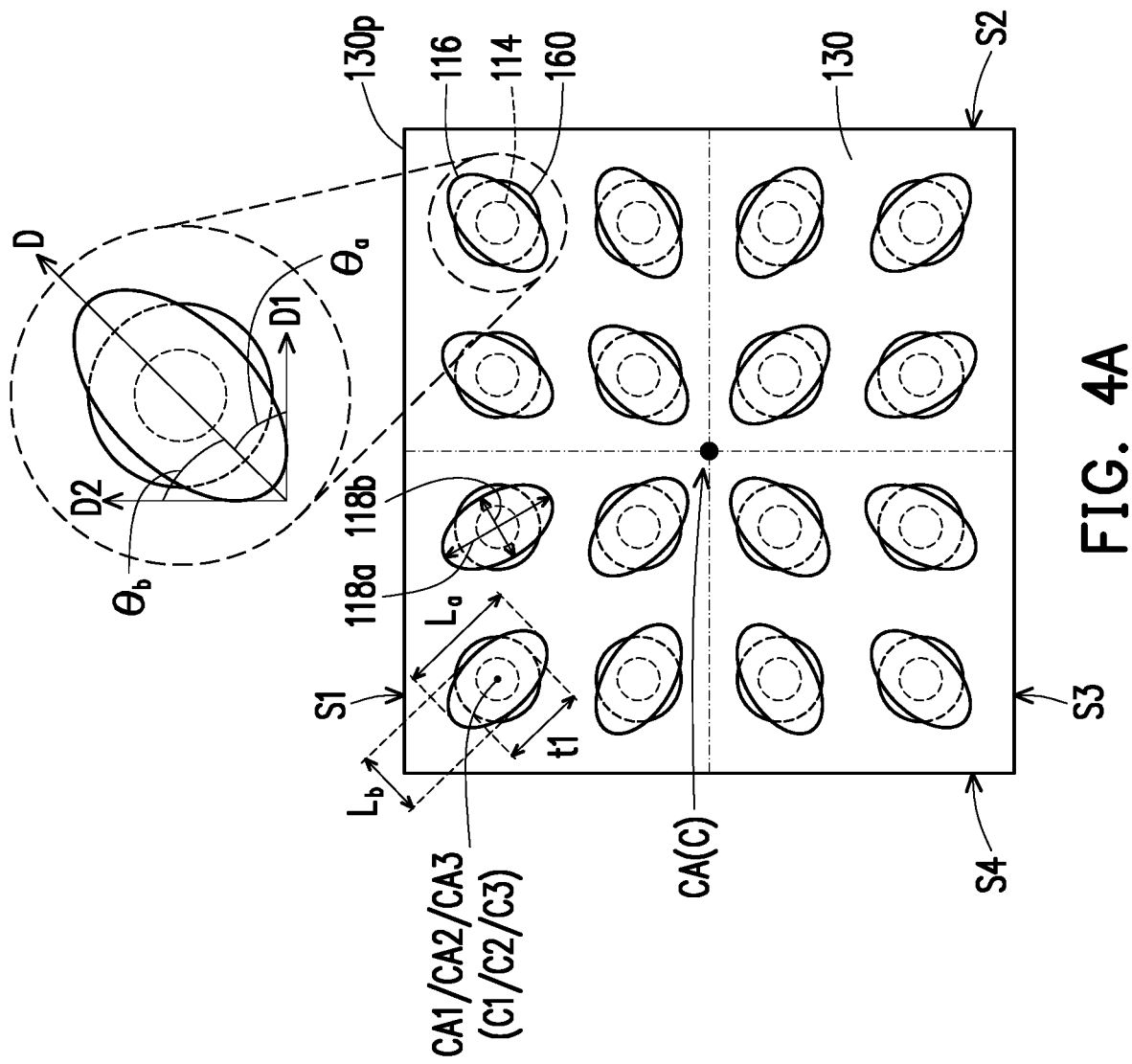
FIG. 4A and FIG. 4B are simplified top views illustrating various arrangements of the conductive patterns in FIG. 1E.
Figure 4B:
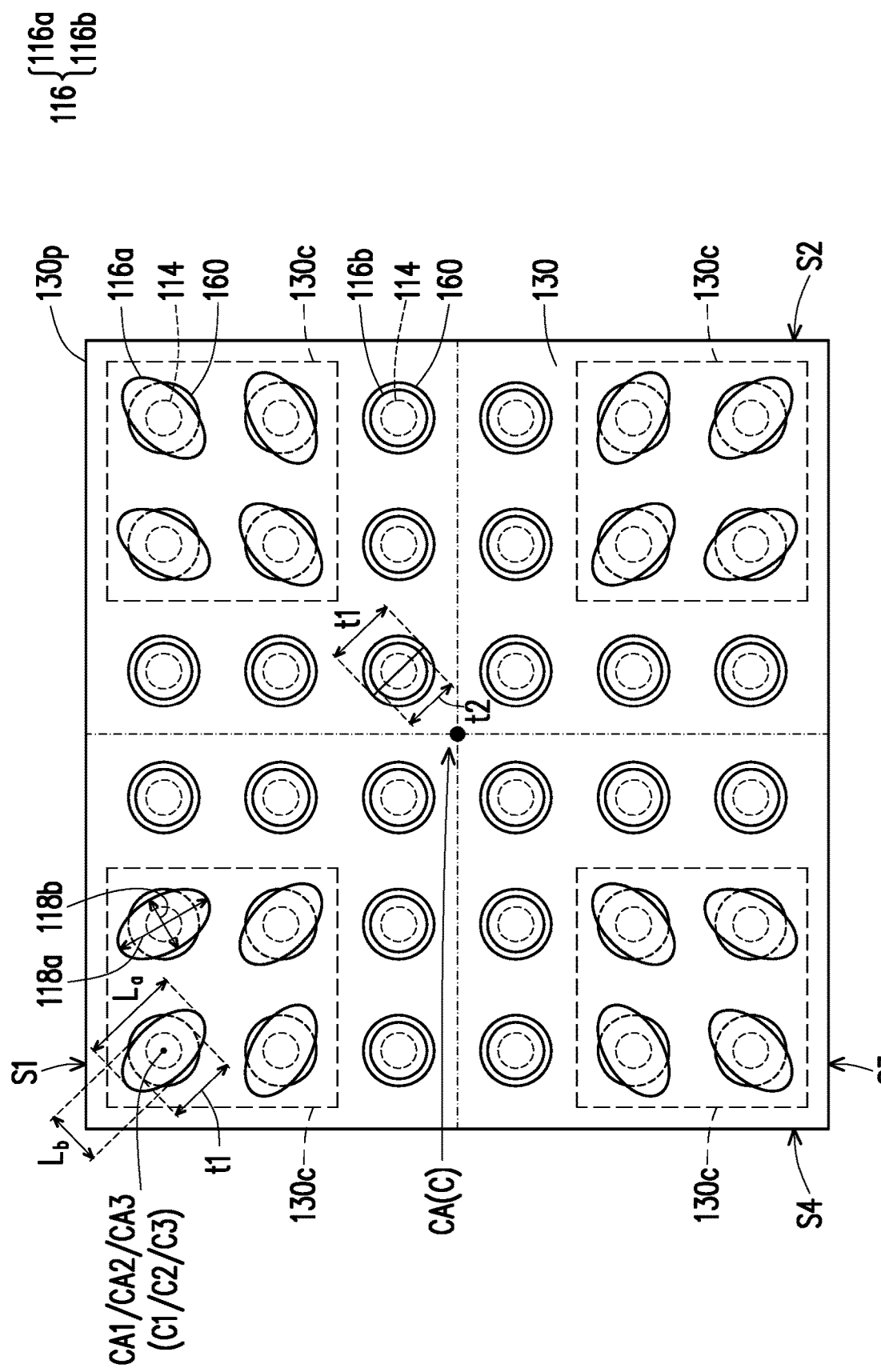

FIG. 2A and FIG. 2B are simplified top views illustrating various arrangements of the conductive patterns 116 in FIG. 1E. Referring to FIG. 1E, in some embodiments, the conductive patterns 116 are disposed directly under the die 130. For example, the conductive patterns 116 are disposed under the die 130 within a periphery 130p of the die 130. The conductive patterns 116 may be arranged to surround a center axis CA of the die 130 (also referred to as an extending line of the center axis CA). Herein, the center axis is a line passing through a center of an object, and the object is substantially symmetric with respect to the center axis. The conductive patterns 116 may be arranged in an array. As illustrated in FIG. 2A, a top view of the conductive pattern 116 has an ellipse-like shape. In other words, a cross-section of the conductive pattern 116 substantially parallel to a surface 130a of the die 130a has an ellipse-like shape. The surface 130a may be an active surface or a rear surface opposite to the active surface. Herein, the term "ellipse" refers to a symmetric shape having two mutually perpendicular axes which intersect at the center thereof due to its symmetry. Similarly, the term "ellipse-like" refers to a shape like an ellipse and having two mutually perpendicular axes which intersect at the center thereof. The ellipse-like shape may not be provided with a smooth periphery or contour and may not be as symmetric as an ellipse due to the process variation and tolerance. However, viewing the shape as the whole, the ellipse-like can be interpreted as an ellipse to some extent. The ellipse-like shape may be an ellipse (as shown in FIG. 4A and FIG. 4B), an oval (as shown in FIG. 2A and FIG. 2B), an oblong (as shown in FIG. 2A and FIG. 2B) or the like. The oblong is a shape having two long sides and two short sides, does not have right angles, and the short sides may be curved in some embodiments. As illustrated in FIG. 2A, the oval (the cross-section of the conductive patterns 116) has a long-axis 118a and a short-axis 118b perpendicular to the long-axis 118a. The long-axis 118a of the conductive pattern 116 is aligned with the center axis CA of the die 130. That is, the long-axis 118a points toward the center axis CA of the die 130, and the long-axis 118a (also referred to as an extending line of the long-axis 118a) intersects with the center axis CA of the die 130. In some embodiments, the long-axis 118a of each conductive pattern 116 intersects with the center axis CA of the die 130.

A length $L_a$ of the long-axis 118a is larger than a length $L_b$ of the short-axis 118b. In other words, the conductive pattern 116 has a longer length $L_b$. In some embodiments, a ratio of the length $L_a$ of the long-axis 118a to the length $L_b$ of the short-axis 118b is greater than 1 and less than 8. In some embodiments, the length $L_a$ of the long-axis 118a ranges from 60 μm to 110 μm. The length $L_a$ of the long-axis 118a may be larger than a maximum length of the UBM pattern 160. For example, the UBM pattern 160 has a circular shape and has a diameter t1. In some embodiments, the length $L_a$ of the long-axis 118a of the conductive pattern 116 is larger than the diameter t1 of the UBM pattern 160, and the diameter t1 of the UBM pattern 160 is larger than or substantially equal to the length $L_b$ of the short-axis 118b of the conductive pattern 116. In alternative embodiments, the UBM pattern 160 is octagonal shaped. In some embodiments, a center axis CA1 of the conductive pattern 116 is substantially collinear with a center axis CA2 of the conductive via 114. That is, the center axis CA1 is entirely overlapping with the center axis CA2. For example, a distance (i.e., the shortest distance) d1 between the center axis CA1 of the conductive pattern 116 to the center axis CA of the die 130 is the same as a distance (i.e., the shortest distance) d2 between the center axis CA2 of the conductive via 114 to the center axis CA of the die 130. In some embodiments, the center axis CA1 of the conductive pattern 116 is substantially collinear with a center axis CA3 of the UBM pattern 160 and a center axis (not shown) of the conductive terminal 162. However, the disclosure is not limited thereto. In some embodiments, the conductive patterns 116 are also referred to as cap patterns since the conductive patterns 116 cover tops of the conductive terminals 162.

In some embodiments, the conductive patterns 116 are arranged to be tilted with respect to extending directions of sidewalls of the die 130. For example, as illustrated in FIG. 2A, the die 130 is a parallelogram having four sides S1-S4 connected to each other. The side S1 and the side S3 may extend along a first direction D1 while the side S2 and the side S4 may extend along a second direction D2. The first direction D1 is perpendicular to the second direction D2, for example. In some embodiments, the long-axis 118a of the oval (the cross-section of the conductive patterns 116) forms an included angle $\theta_a$ with the first direction D1, and the included angle $\theta_a$ is larger than 0° and smaller than 90°. In some embodiments, the long-axis 118a of the oval (the cross-section of the conductive patterns 116) forms an included angle $\theta_b$ with the second direction D2, and the included angle $\theta_b$ is larger than 0° and smaller than 90°.

FIG. 2A also shows a projection of the die 130, the conductive patterns 116, the conductive vias 114 and the UBM patterns 160 onto a surface such as a front or rear surface of the die 130 and a front or rear surface of the package substrate 202. For example, FIG. 2A illustrates a projection of the die 130, the conductive patterns 116, the conductive vias 114 and the UBM patterns 160 onto the surface 130a of the die 130 or a surface 202a of the package substrate 202. As shown in FIG. 2A, in some embodiments, in the projection onto the surface 130a or 202a, a center C1 of the conductive pattern 116 is overlapped with a center C2 of the conductive via 114 and a center C3 of the UBM pattern 160. The long-axis 118a of the conductive pattern 116 is in a direction D from the center C1 of the conductive pattern 116 to a center C of the die 130. In other words, the conductive pattern 116 is enlarged/extended along the direction D and thus has a larger length $L_a$ in the direction D.

In some embodiments, at the cooling stage, a coefficient of thermal expansion (CTE) mismatch is present between the package substrate 202 and the die 130, which may induce stress concentration at an outer edge of the conductive pattern 116 and lead to a crack of the passivation layer 112 aside the conductive pattern 116. In some embodiments, by extending the conductive pattern 116 along the direction D from the center C1 of the conductive pattern 116 to the center C of the die 130, the conductive pattern 116 has an ellipse-like shape, and the stress is reduced.

Referring to FIG. 2B, an alternative configuration of the conductive patterns 116 is provided. As illustrated in FIG. 2B, the conductive patterns 116 directly under the die 130 may be constituted by a plurality of first conductive patterns 116a and a plurality of second conductive patterns 116b. As illustrated in FIG. 2B, a top view of the first conductive pattern 116a has an ellipse-like shape while a top view of the second conductive pattern 116b has a circular shape. In other words, a cross-section of the first conductive pattern 116a substantially parallel to the surface 130a of the die 130 has an ellipse-like shape, and a cross-section of the second conductive pattern 116b parallel to the surface 130a of the die 130 has a circular shape. The first conductive patterns 116a and the UBM patterns 160 are similar to the conductive patterns 116 and the UBM patterns 160 of FIG. 2A except that the first conductive patterns 116a are arranged at regions corresponding to corners 130c of the die 130. For example, as illustrated in FIG. 2B, the second conductive patterns 116b are sandwiched between the first conductive patterns 116a. The long-axis 118a of the first conductive pattern 116a intersects with the center axis CA of the die 130. In some embodiments, the long-axis 118a of each conductive pattern 116a intersects with the center axis CA of the die 130. In some embodiments, the length $L_a$ of the long-axis 118a of the first conductive pattern 116a is larger than the diameter t1 of the UBM pattern 160, and the diameter t1 of the UBM pattern 160 is larger than or substantially equal to the length $L_b$ of the short-axis 118b of the first conductive pattern 116a. A diameter t2 of the second conductive pattern 116b is smaller than the diameter t1 of the UBM pattern 160, for example. In some embodiments, the center axis CA1 of the first conductive pattern 116a is substantially collinear with the center axis CA2 of the conductive via 114. In some embodiments, the center axis CA1 of the first conductive pattern 116a is substantially collinear with the center axis CA3 of the UBM pattern 160 and the center axis (not shown) of the conductive terminal 162. Similarly, in some embodiments, the center axes (not shown) of the second conductive pattern 116b, the conductive via 114, the UBM pattern 160 and the conductive terminal 162 are substantially collinear with one another. However, the disclosure is not limited thereto. In addition, in alternative embodiments, the second conductive patterns 116b disposed between the first conductive patterns 116a have other suitable shape. In an embodiment in which the second conductive pattern 116b has the same shape as the first conductive pattern 116a, the long-axis of the second conductive pattern 116b may or may not intersect with the center axis CA of the die 130.

Similar to FIG. 2A, FIG. 2B also shows a projection of the die 130, the conductive patterns 116, the conductive vias 114 and the UBM patterns 160 onto the surface 130a of the die 130 or the surface 202a of the package substrate 202. As shown in FIG. 2B, in some embodiments, in the projection onto the surface 130a or 202a, a center C1 of the conductive pattern 116a is overlapped with a center C2 of the conductive via 114 and a center C3 of the UBM pattern 160. Similarly, centers (not shown) of the conductive pattern 116b, the conductive via 114 and the UBM pattern 160 are overlapped. The long-axis 118a of the conductive pattern 116a is in a direction D from the center C1 of the conductive pattern 116a to a center C of the die 130. In other words, the conductive pattern 116a is enlarged/extended along the direction D and thus has a larger length $L_a$ in the direction D.

In some embodiments, since the stress mentioned above is larger at regions corresponding to the corners 130c of the die 130 than other sites, the conductive patterns 116a at these regions are designed to have an ellipse-like shape. In other words, the conductive patterns 116a in the regions corresponding to the corners 130c of the die 130 are configured to have a larger size than the UBM patterns 160 therebeneath while the conductive patterns 116b in other regions may remain to have a size smaller than the UBM patterns 160 therebeneath.

Figure 3A:
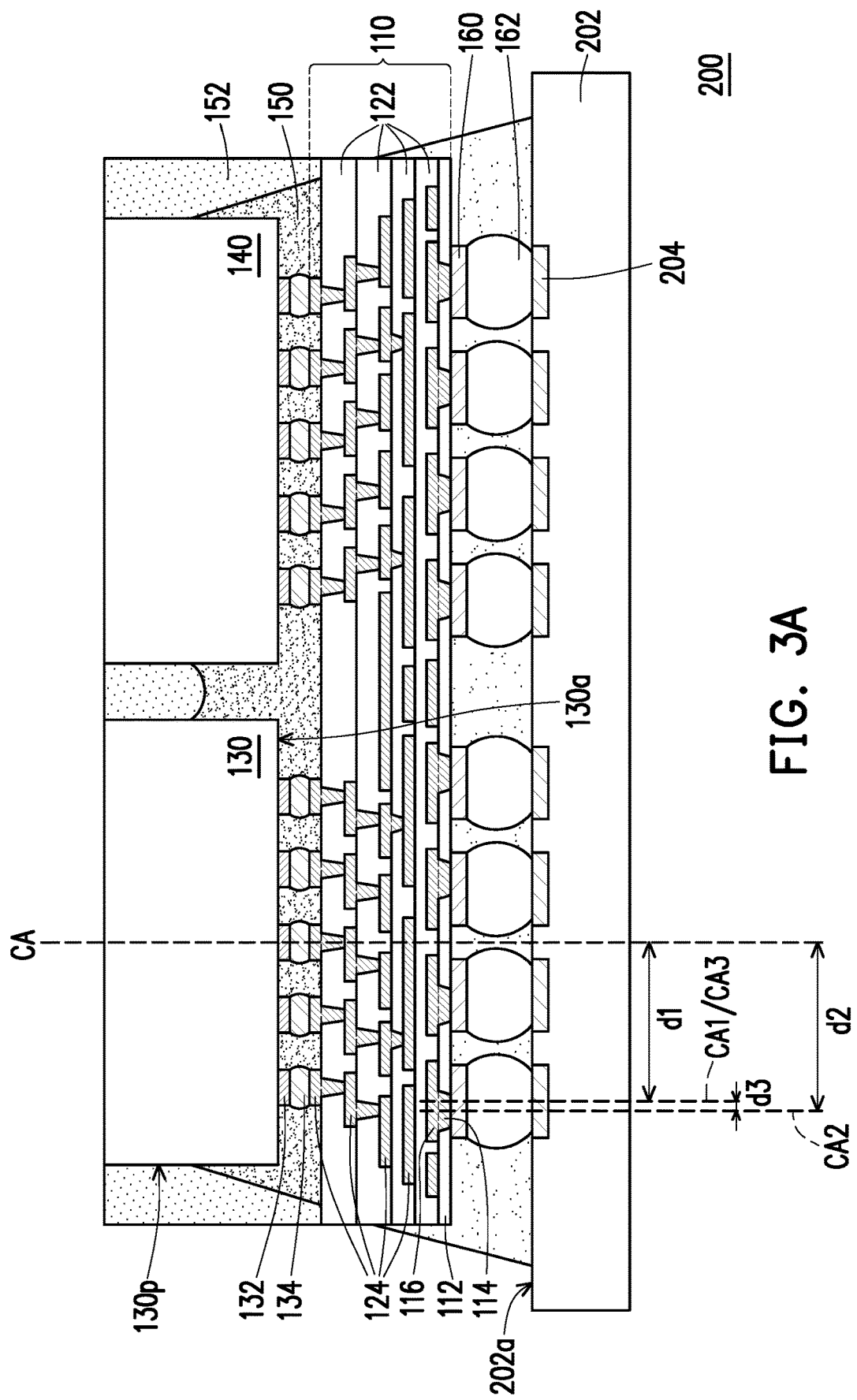
FIG. 3A is a schematic cross-sectional view of a semiconductor package in accordance with some embodiments of the disclosure.
Figure 3B:
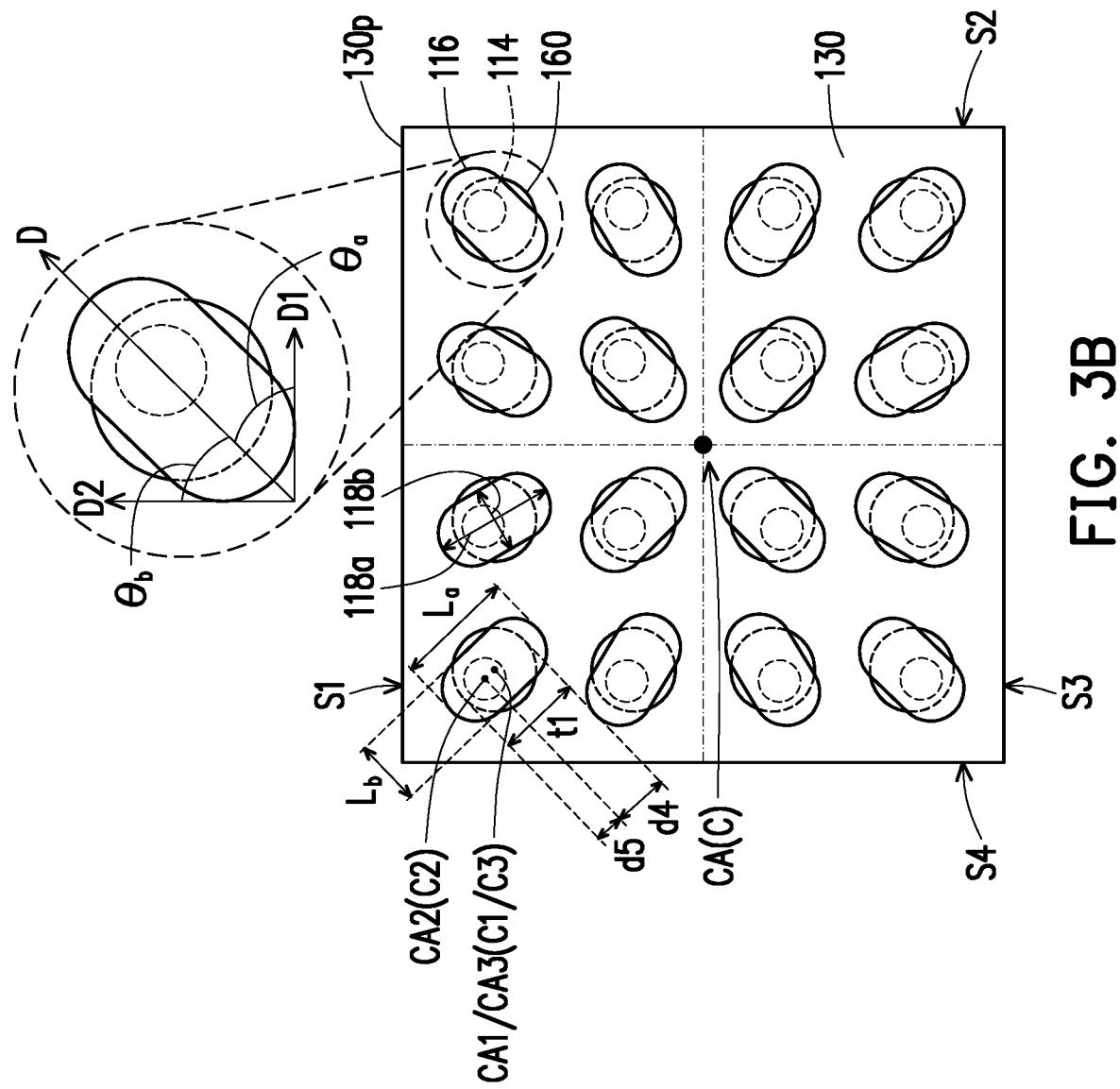
FIG. 3B is a simplified top view of FIG. 3A.

In alternative embodiments, as shown in FIGS. 3A and 3B, the configuration of the conductive structures 200 is similar to that of FIG. 1E and FIG. 2A, and the main difference lies the center axis CA2 of the conductive via 114 is not collinear with the center axis CA1 of the conductive pattern 116. For example, as shown in FIGS. 3A and 3B, the center axis CA2 of the conductive via 114 is shifted with respect to the center axis CA1 of the conductive pattern 116, so as to be farther away from the center axis CA of the die 130 than the center axis CA1 of the conductive pattern 116. In some embodiments, the center axis (not shown) of the conductive terminal 162 is collinear with the center axis CA1 of the conductive pattern 116. In some embodiments, a distance d1 (i.e., the shortest distance) between the center axis CA1 of the conductive pattern 116 to the center axis CA of the die 130 is smaller than a distance d2 (i.e., the shortest distance) between the center axis CA2 of the conductive via 114 to the center axis CA of the die 130. In some embodiments, a distance d3 between the center axis CA2 of the conductive via 114 and the center axis CA1 of the conductive pattern 116 ranges from 3 μm to 30 μm.

FIG. 3B also shows a projection of the die 130, the conductive patterns 116, the conductive vias 114 and the UBM patterns 160 onto a surface such as a front or rear surface of the die 130 and a front or rear surface of the package substrate 202. For example, FIG. 3B illustrates a projection of the die 130, the conductive patterns 116, the conductive vias 114 and the UBM patterns 160 onto the surface 130a of the die 130 or the surface 202a of the package substrate 202. As shown in FIG. 3B, in some embodiments, in the projection onto the surface 130a or 202a, the center C1 of the conductive pattern 116 is overlapped with the center C3 of the UBM pattern 160. In some embodiments, the center C2 of the conductive via 114 is shifted with respect to the centers C1, C3 of the conductive pattern 116 and the UBM pattern 160. The center C2 of the conductive via 114 may be shifted outward along the direction D from the center C1 of the conductive pattern 116 to the center C of the die 130 with respect to the center C1 of the conductive pattern 116. A distance d4 between the center C2 of the conductive via 114 to an inner edge of the UBM pattern 160 along the direction D is larger than a distance d5 between the center C2 of the conductive via 114 to an outer edge of the UBM pattern 160 along the direction D. A difference between the distance d4 and the distance d5 is equal to the distance d3 and ranges from 3 μm to 30 μm. The conductive pattern 116 has a larger length $L_a$ in the direction D from the center C1 of the conductive pattern 116 to the center C of the die 130. In other words, the conductive pattern 116 is enlarged along the direction D. In some embodiments, by shifting the conductive vias 114 outward along the direction D from the center C1 of the conductive pattern 116 to the center C of the die 130, the stress is further reduced.

In above embodiments, the conductive patterns 116 disposed directly under the die 130 are configured as FIG. 2A, FIG. 2B, FIG. 3B or other similar arrangement, and the conductive patterns 116 disposed directly under the die 140 may have other arrangement. For example, each of the conductive patterns 116 disposed directly under the die 140 has a circular shape, and each of these conductive patterns 116 has a smaller diameter than the UBM patterns 160 or substantially the same diameter as the UBM patterns 160.

However, the disclosure is not limited thereto. In alternative embodiments, the conductive patterns 116 disposed directly under the die 140 are also configured as the conductive patterns 116 of FIG. 2A, FIG. 2B and FIG. 3B or other similar arrangement. In other words, according to the design, the conductive patterns 116 and/or the conductive vias 114 may be configured corresponding to one or more dies of the semiconductor package.

In some embodiments, by extending the conductive pattern of the redistribution structure along the direction toward to the center axis of the die, the conductive pattern has an ellipse-like shape. In addition, in some embodiments, the conductive via is shifted outward along the direction with respect to the center of the conductive pattern. Accordingly, the stress due to the CTE mismatch between the package substrate and the die may be reduced. Therefore, the performance of the formed semiconductor package may be improved.

In accordance with some embodiments of the disclosure, a semiconductor package includes a die, a redistribution structure and a plurality of conductive terminals. The redistribution structure is disposed below and electrically connected to the die. The redistribution structure includes a plurality of conductive patterns, and at least one of the plurality of conductive patterns has a cross-section substantially parallel to the surface of the die. The cross-section has a long-axis and a short-axis, and the long-axis intersects with a center axis of the die. The conductive terminals are disposed below and electrically connected to the redistribution structure.

In accordance with some embodiments of the disclosure, a semiconductor package includes a redistribution structure, a die, an underfill and an encapsulant. The redistribution structure includes a plurality of first conductive patterns and a plurality of second conductive patterns. The plurality of first conductive patterns have an ellipse-like shape respectively, and the plurality of second conductive patterns have a circular shape respectively. The die is disposed over and electrically connected to the redistribution structure. The underfill is disposed between the die and the redistribution structure. The encapsulant encapsulates the die over the redistribution structure.

In accordance with some embodiments of the disclosure, a semiconductor package includes a die, a redistribution structure and a plurality of under-ball metallurgy (UBM) patterns. The die has a first center axis. The redistribution structure is disposed below and electrically connected to the die, and includes a plurality of conductive patterns and a plurality of conductive vias. The plurality of conductive vias are disposed between and in direct with the plurality of conductive patterns and the plurality of UBM patterns. One of the plurality of conductive vias has a second center axis, a respective one of the plurality of UBM patterns under the one of the plurality of conductive vias has a third center axis, and a distance between the second center axis and the first center axis is larger than a distance between the third center axis and the first center axis.

In accordance with some embodiments of the disclosure, a semiconductor package includes a die, a first conductive pattern, a second conductive pattern and first and second under-ball metallurgy (UBM) patterns. The first conductive pattern and the second conductive pattern are disposed below and electrically connected to the die, wherein the first conductive pattern has an ellipse-like shape, and the second conductive pattern has a circular shape. The first and second UBM patterns correspond to the first and second conductive patterns, the first conductive pattern has a first length, the second conductive pattern has a second length, the first and second UBM patterns have a third length, wherein the first length is larger than the third length and the second length is smaller than the third length.

In accordance with some embodiments of the disclosure, a semiconductor package includes a die and a redistribution structure. The redistribution structure is electrically connected to the die. The redistribution structure includes a plurality of first conductive patterns and a plurality of second conductive patterns, wherein the first conductive patterns have an ellipse-like shape respectively, the second conductive patterns have a circular shape respectively, and the first conductive patterns are arranged at corners of the die.

In accordance with some embodiments of the disclosure, a semiconductor package includes a die, a conductive pattern, a conductive via and an under-ball metallurgy (UBM) pattern. The die has a first center axis. The conductive via is disposed between the conductive pattern and the UBM pattern, wherein the conductive via has a second center axis, the UBM pattern has a third center axis, and a distance between the second center axis and the first center axis is larger than a distance between the third center axis and the first center axis.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor package, comprising:
    a die;
    a first conductive pattern and a second conductive pattern disposed below and electrically connected to the die, wherein the first conductive pattern has an ellipse-like shape, and the second conductive pattern has a circular shape; and
    first and second under-ball metallurgy (UBM) patterns corresponding to the first and second conductive patterns, the first conductive pattern having a first length, the second conductive pattern having a second length, the first and second UBM patterns having a third length, wherein the first length is larger than the third length and the second length is smaller than the third length.

2. The semiconductor package according to claim 1, wherein the first conductive pattern comprises a plurality of first conductive patterns, the second conductive pattern comprises a plurality of second conductive patterns, and the first conductive patterns and the second conductive patterns are arranged to surround a center axis of the die.

3. The semiconductor package according to claim 1, wherein two opposite sides of the die are arranged along a first direction and another two opposite sides of the die are arranged along a second direction perpendicular to the first direction, a long-axis of the first conductive pattern forms an included angle with the first direction, and the included angle is larger than 0° and smaller than 90°.

4. The semiconductor package according to claim 1 further comprising a first conductive via, wherein the first conductive via is disposed between and in direct contact with the first conductive pattern and the first UBM pattern.

5. The semiconductor package according to claim 1, wherein the first conductive patterns are disposed at corners of the die, and the second conductive patterns are disposed between the corners of the die.

6. The semiconductor package according to claim 1, wherein a largest distance between the first conductive pattern and a center axis of the die is larger than a largest distance between the second conductive pattern and the center axis of the die.

7. The semiconductor package according to claim 1 further comprising an underfill surrounding the first and second UBM patterns.

8. A semiconductor package, comprising:
    a die;
    a redistribution structure electrically connected to the die, comprising a plurality of first conductive patterns and a plurality of second conductive patterns, wherein the first conductive patterns have an ellipse-like shape respectively, the second conductive patterns have a circular shape respectively, and the first conductive patterns and the second conductive patterns are arranged to surround a center axis of the die; and
    a under-ball metallurgy (UBM) pattern, wherein one of the first conductive patterns is disposed between the UBM pattern and the die, each of the first conductive patterns has a first length, each of the second conductive patterns has a second length, the UBM pattern has a third length, and the first length is larger than the third length and the second length is smaller than the third length.

9. The semiconductor package according to claim 8, wherein the second conductive patterns are arranged from the center axis to an edge of the die.

10. The semiconductor package according to claim 8, wherein each of the first conductive patterns has a long-axis and a short-axis, two opposite sides of the die are arranged along a first direction and another two opposite sides of the die are arranged along a second direction perpendicular to the first direction, the long-axis forms an included angle with the first direction, and the included angle is larger than 0° and smaller than 90°.

11. The semiconductor package according to claim 8 further comprising a conductive via, wherein the conductive via is disposed between and in direct with the one of the first conductive patterns and the UBM pattern.

12. The semiconductor package according to claim 8, wherein the first conductive patterns are arranged at opposite corners of the die.

13. The semiconductor package according to claim 8, wherein the first conductive patterns are arranged at each corner of the die.

14. The semiconductor package according to claim 8, wherein the die comprises a bond pad connected to the redistribution structure, and the bond pad is disposed between the die and the first conductive patterns.

15. The semiconductor package according to claim 8, wherein the UMB pattern is overlapped with one of the first conductive patterns and the second conductive patterns.

16. A semiconductor package, comprising:
    a die, having a first center axis;
    a conductive pattern and a conductive via; and
    an under-ball metallurgy (UBM) pattern, the conductive via disposed between the conductive pattern and the UBM pattern, wherein the conductive via has a second center axis, the UBM pattern has a third center axis, and a distance between the second center axis and the first center axis is larger than a distance between the third center axis and the first center axis, wherein a center axis of the conductive pattern is overlapped with the third center axis.

17. The semiconductor package according to claim 16, wherein the conductive via is in direct with the conductive pattern and the UBM pattern.

18. The semiconductor package according to claim 16, wherein the conductive pattern has an ellipse-like shape.

19. The semiconductor package according to claim 16, wherein two opposite sides of the die are arranged along a first direction and another two opposite sides of the die are arranged along a second direction perpendicular to the first direction, a long-axis of the conductive pattern forms an included angle with the first direction, and the included angle is larger than 0° and smaller than 90°.

20. The semiconductor package according to claim 16 further comprising an underfill surrounding the UBM pattern.

\* \* \* \* \*